(12) United States Patent
Wang et al.

(10) Patent No.: US 10,236,273 B2
(45) Date of Patent: Mar. 19, 2019

(54) PACKAGING STRUCTURE INCLUDING INTERCONNECS AND PACKAGING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Chong Wang, Shanghai (CN); Hai Fang Zhang, Shanghai (CN); Xuan Jie Liu, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/614,056

(22) Filed: Jun. 5, 2017

(65) Prior Publication Data
US 2017/0271306 A1    Sep. 21, 2017

(30) Foreign Application Priority Data
Jun. 12, 2016   (CN) .......................... 2016 1 0407331

(51) Int. Cl.
*H01L 25/04* (2014.01)
*H01L 23/00* (2006.01)
*H01L 23/053* (2006.01)
(Continued)

(52) U.S. Cl.
CPC ...... *H01L 25/043* (2013.01); *H01L 21/76898* (2013.01); *H01L 23/053* (2013.01);
(Continued)

(58) Field of Classification Search
CPC ................. H01L 25/043; H01L 23/481; H01L 21/76898; H01L 23/64; H01L 51/0017;
(Continued)

(56) References Cited

U.S. PATENT DOCUMENTS 8,012,796 B2 *  9/2011  Andry ................ H01L 21/6835
                                                        438/107
8,222,104 B2 *  7/2012  Booth, Jr. ........... H01L 27/0805
                                                        257/296

(Continued)

OTHER PUBLICATIONS

The European Patent Office (EPO) The Extended European Search Report for 17174789.2 dated Nov. 8, 2017 10 Pages.

*Primary Examiner* — John P. Dulka
(74) *Attorney, Agent, or Firm* — Anova Law Group, PLLC

(57) ABSTRACT

A packaging structure and a packaging method are provided. The packaging structure includes a carrier semiconductor structure including a carrier substrate, a carrier dielectric layer, and a carrier top conductive layer inside the carrier dielectric layer and having a top exposed by the carrier dielectric layer. The packaging structure also includes a top semiconductor structure including a top substrate, a first dielectric layer, a zeroth conductive layer, and a second dielectric layer, wherein a position of the zeroth conductive layer corresponds to a position of the carrier top conductive layer. Further, the packaging structure includes a conductive plug formed on one side of the zeroth conductive layer, and penetrating through the top substrate, the first dielectric layer, and the second dielectric layer, wherein the conductive plug is electrically connected to each of the zeroth conductive layer and the carrier top conductive layer.

20 Claims, 7 Drawing Sheets

(51) Int. Cl.
*H01L 23/31* (2006.01)
*H01L 23/12* (2006.01)
*H01L 51/00* (2006.01)
*H01L 23/64* (2006.01)
*H01L 21/768* (2006.01)
*H01L 23/48* (2006.01)

(52) U.S. Cl.
CPC .......... *H01L 23/12* (2013.01); *H01L 23/3142* (2013.01); *H01L 23/481* (2013.01); *H01L 23/64* (2013.01); *H01L 24/743* (2013.01); *H01L 51/0017* (2013.01)

(58) Field of Classification Search
CPC . H01L 23/3142; H01L 23/053; H01L 24/743; H01L 23/12
See application file for complete search history.

(56) References Cited

U.S. PATENT DOCUMENTS

| | | | |
|---|---|---|---|
| 9,776,856 B2* | 10/2017 | Cheng | B81C 1/00238 |
| 2007/0037379 A1* | 2/2007 | Enquist | H01L 21/76898 438/618 |
| 2013/0321680 A1 | 12/2013 | Kumano | |
| 2015/0187701 A1 | 7/2015 | Tsai et al. | |
| 2015/0221695 A1 | 8/2015 | Papk et al. | |
| 2015/0294956 A1 | 10/2015 | Huang et al. | |
| 2015/0311168 A1* | 10/2015 | Yu | H01L 24/03 257/737 |
| 2015/0348928 A1* | 12/2015 | Co | H01L 24/17 257/712 |
| 2018/0068984 A1* | 3/2018 | Beyne | H01L 23/481 |

* cited by examiner

| Providing a carrier semiconductor structure including a carrier substrate, a carrier dielectric layer on the carrier substrate, and a carrier interconnection structure inside the carrier dielectric layer, where the carrier interconnection structure includes a carrier top conductive layer | S101 |

| Providing a top semiconductor structure including a first dielectric layer on a top substrate, a zeroth conductive layer on the first dielectric layer, and a second dielectric layer covering the first dielectric layer and the zeroth conductive layer | S102 |

| Forming a second adhesive layer on the carrier dielectric layer | S103 |

| Forming a first adhesive layer on the second dielectric layer | S104 |

| Flipping the top semiconductor structure on the carrier semiconductor structure, and performing a bonding process on the top semiconductor structure and the carrier semiconductor structure, where a position of the zeroth conductive layer corresponds to a position of the carrier top conductive layer | S105 |

| Forming a conductive through hole on one side of the zeroth conductive layer by sequentially etching the top substrate, the first dielectric layer and the second dielectric layer along a direction from a back surface to a front surface of the top substrate, where the conductive through hole exposes the zeroth conductive layer and the carrier top conductive layer | S106 |

| Forming a conductive plug to fill up the conductive through hole | S107 |

| Forming a passivation layer covering the conductive plug | S108 |

Figure 15

PACKAGING STRUCTURE INCLUDING INTERCONNECS AND PACKAGING METHOD THEREOF

CROSS-REFERENCES TO RELATED APPLICATIONS

This application claims the priority of Chinese patent application No. 201610407331.6, filed on Jun. 12, 2016, the entirety of which is incorporated herein by reference.

FIELD OF THE DISCLOSURE

The present disclosure generally relates to the field of semiconductor and, more particularly, relates to a packaging structure and packaging method thereof.

BACKGROUND

With the development trend of ultra-large-scale integrated circuit in semiconductor manufacturing, critical dimensions of the integrated circuit continues to decrease. Correspondingly, more packaging requirements of the integrated circuit are needed. Based on a two-dimensional packaging within the X-Y plane of the multichip-module (MCM), a three-dimensional (3D) packaging technique stacked along the Z direction has been fully developed. The packaging structure with 3D packaging technique has a higher device density.

A three-dimensional integrated circuit (3D IC) is formed by using the advanced chip stacking technique. For example, an integrated circuit having a three-dimensional structure is formed by stacking the chips with different functions. Compared to the integrated circuit with a two-dimensional structure, the chip stacking technique of the three-dimensional integrated circuit can not only shorten the signal transmission path of the three-dimensional integrated circuit, but also accelerate the operating speed of the three-dimensional integrated circuit. Thus, many demands, such as higher performance, smaller size, lower power consumption, and more functions, of the semiconductor device can be satisfied.

According to different connection methods between chips in the three-dimensional integrated circuit, techniques interconnecting stacked chips can be divided into three types: a metal wire bonding packaging, a flip-chip bonding packaging, and a through silicon via (TSV) packaging. Among them, the TSV packaging technology has many advantages such as higher density of chips stacked in the three-dimensional directions, shorter interconnection lines between chips, smaller size, higher chip speed, and lower power consumption, etc., and, therefore, has become the most common method to achieve interconnection between the stacked chips in the three-dimensional integrated circuit. However, the processes of the existing packaging technology need to be simplified.

The disclosed device structures and methods are directed to solve one or more problems set forth above and other problems.

BRIEF SUMMARY OF THE DISCLOSURE

One aspect of the present disclosure includes a packaging structure. The packaging structure includes a carrier semiconductor structure including a carrier substrate, a carrier dielectric layer on the carrier substrate, and a carrier interconnection structure inside the carrier dielectric layer, wherein the carrier interconnection structure includes a carrier top conductive layer having a top exposed by the carrier dielectric layer. The packaging structure also includes a top semiconductor structure inversely bonded to the carrier semiconductor structure, and including a first dielectric layer on a top substrate, a zeroth conductive layer on the first dielectric layer, and a second dielectric layer covering the first dielectric layer and the zeroth conductive layer, wherein a position of the zeroth conductive layer corresponds to a position of the carrier top conductive layer. Further, the packaging structure includes a conductive plug formed on one side of the zeroth conductive layer, and penetrating through the top substrate, the first dielectric layer, and the second dielectric layer, wherein the conductive plug is electrically connected to each of the zeroth conductive layer and the carrier top conductive layer.

Another aspect of the present disclosure includes a packaging method. The packaging method includes providing a carrier semiconductor structure including a carrier substrate, a carrier dielectric layer on the carrier substrate, and a carrier interconnection structure inside the carrier dielectric layer, wherein the carrier interconnection structure includes a carrier top conductive layer having a top exposed by the carrier dielectric layer. The packaging method also includes providing a top semiconductor structure including a first dielectric layer on a top substrate, a zeroth conductive layer on the first dielectric layer, and a second dielectric layer covering the first dielectric layer and the zeroth conductive layer. In addition, the packaging method includes flipping the top semiconductor structure on the carrier semiconductor structure, and performing a bonding process on the top semiconductor structure and the carrier semiconductor structure, wherein a position of the zeroth conductive layer corresponds to a position of the carrier top conductive layer. Moreover, the packaging method includes forming a conductive through hole on one side of the zeroth conductive layer by sequentially etching the top substrate, the first dielectric layer and the second dielectric layer along a direction from a back surface to a front surface of the top substrate, wherein the conductive through hole exposes the zeroth conductive layer and the carrier top conductive layer. Further, the packaging method includes forming a conductive plug to fill up the conductive through hole.

Other aspects of the present disclosure can be understood by those skilled in the art in light of the description, the claims, and the drawings of the present disclosure.

BRIEF DESCRIPTION OF THE DRAWINGS

FIG. 15 illustrates an exemplary packaging process to form a packaging structure consistent with various disclosed embodiments of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
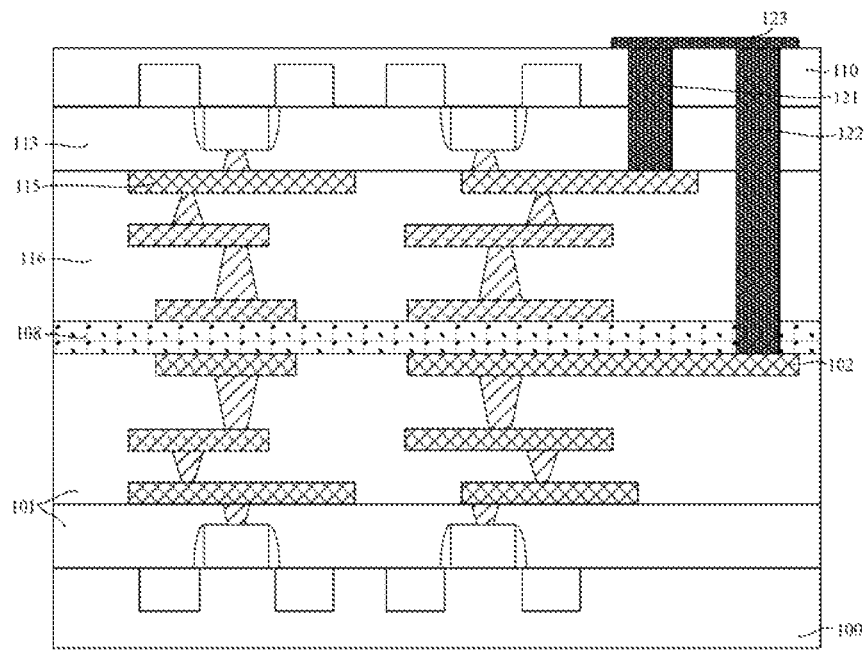
FIG. 1 illustrates an existing packaging structure.

FIG. 1 illustrates an existing packaging structure. Referring to FIG. 1, the packaging structure includes a carrier semiconductor structure (not labeled), and a top semiconductor structure (not labeled) inversely or flip-chip bonded to the carrier semiconductor structure.

The carrier semiconductor structure includes a carrier substrate 100, a carrier dielectric layer 101 formed on the carrier substrate 100, and a carrier interconnection structure (not labeled) formed inside the carrier dielectric layer 101. The carrier interconnection structure includes a carrier top conductive layer 102 having a top exposed by the carrier dielectric layer 101.

The top semiconductor structure includes a top substrate 110, a first dielectric layer 113 formed on the top substrate 110, a zeroth conductive layer 115 formed on the first dielectric layer 113, and a second dielectric layer 116 covering the first dielectric layer 113 and the zeroth conductive layer 115.

The packaging structure also includes an adhesive layer 108 formed between the top semiconductor structure and the carrier semiconductor structure. The adhesive layer 108 is configured to achieve bonding of the top semiconductor structure to the carrier semiconductor structure, and to increase bonding strength.

To achieve an interconnection packaging of the top semiconductor structure and the carrier semiconductor structure, the packaging structure includes a first conductive plug 121 and a second conductive plug 122. For example, the first conductive plug 121 penetrates through the top substrate 110 and the first dielectric layer 113, and is in contact with the zeroth conductive layer 115 to achieve electrical connection with the top semiconductor structure. The second conductive plug 122 penetrates through the top substrate 110, the first dielectric layer 113, the second dielectric layer 116, and the adhesive layer 108, and is in contact with the carrier top conductive layer 102 to achieve electrical connection with the carrier semiconductor structure. Then the first conductive plug 121 and the second conductive plug 122 are electrically connected through a connection conductive layer 123, to finally achieve the interconnection between the top semiconductor structure and the carrier semiconductor structure.

However, the first conductive plug 121 and the second conductive plug 122 are different in depth and need to be formed by a two-step process. In addition, another process step is required to form the connection conductive layer 123. Therefore, the process of the existing packaging technique is complex, and the mask cost is high.

Figure 2:
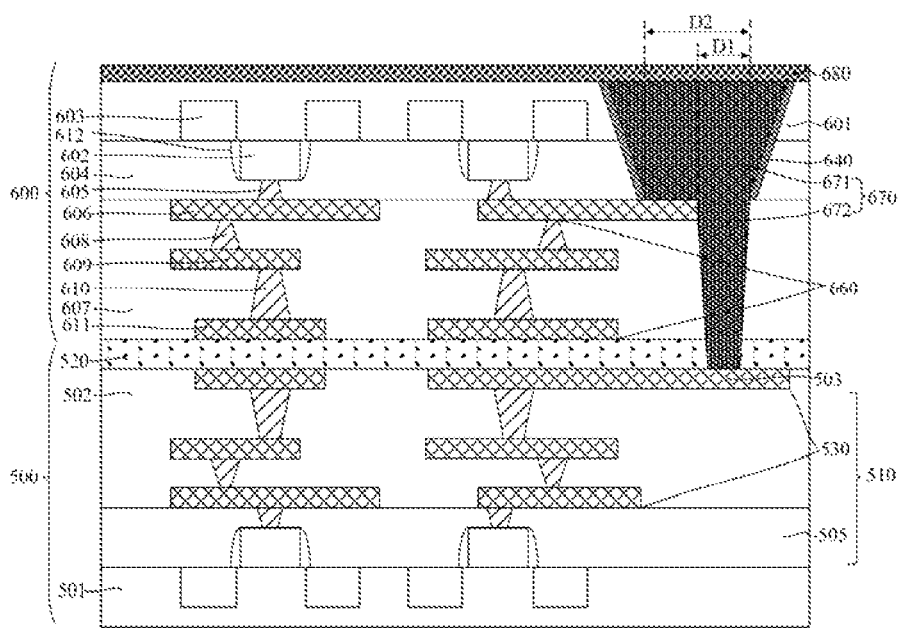
FIG. 2 illustrates an exemplary packaging structure consistent with various disclosed embodiments of the present disclosure.

The present disclosure provides a packaging structure and packaging method. FIG. 2 illustrates a packaging structure consistent with the disclosed embodiments.

Referring to FIG. 2, the packaging structure may include a carrier semiconductor structure 500, a top semiconductor structure 600 inversely or flip-chip bonded to the carrier semiconductor structure, and a conductive plug 670.

The carrier semiconductor structure 500 may include a carrier substrate 501, a carrier dielectric layer 510 formed on the carrier substrate 501, and a carrier interconnection structure 530 formed inside the carrier dielectric layer. The carrier interconnection structure 530 may include a carrier top conductive layer 503 having a top exposed by the carrier dielectric layer.

The top semiconductor structure may include a top substrate 601, a first dielectric layer 604 formed on the top substrate 601, a zeroth conductive layer 606 formed on the first dielectric layer 604, and a second dielectric layer 607 covering the first dielectric layer 604 and the zeroth conductive layer 606. The position of the zeroth conductive layer 606 may correspond to the position of the carrier top conductive layer 503.

The conductive plug 670 may penetrate through the top substrate 601, the first dielectric layer 604, and the second dielectric layer 607. The conductive plug 670 may be formed at one side of the zeroth conductive layer 606, and be in contact with the zeroth conductive layer 606 and the carrier top conductive layer 503.

In one embodiment, the top substrate 601 may be made of silicon. In another embodiment, the top substrate 601 may be made of germanium, silicon germanium, silicon carbide, gallium arsenide, or indium gallium, etc. In certain embodiments, the top substrate 601 may be a silicon on insulator (SOI) substrate formed by a bottom semiconductor layer, an insulating material layer, and a top semiconductor layer. The bottom semiconductor layer may be made of silicon, germanium, silicon germanium, silicon carbide, gallium arsenide, or indium gallium, etc. The insulating material layer may be made of silicon oxide, silicon nitride, silicon oxynitride, silicon carbonitride, or silicon oxycarbonitride, etc. The top semiconductor layer may be made of silicon, germanium, silicon germanium, silicon carbide, gallium arsenide, or indium gallium, etc.

In one embodiment, the top semiconductor structure may also include a gate structure 602 formed on the top substrate 601, and a doping region 603 formed in the top substrate 601 at both sides of the gate structure 602. The first dielectric layer 604 may cover the gate structure 602 and the doping region 603, and the top of the first dielectric layer 604 may be above the top of the gate structure 602. In addition, the top semiconductor structure may include a zeroth conductive plug 605 formed in the first dielectric layer 604 and above the gate structure 602, and directly contacting with the top of the gate structure 602. The zeroth conductive plug 605 may be connected to the zeroth conductive layer 606. Moreover, the top semiconductor structure may include an interconnection structure 660 formed inside the second dielectric layer 607 and electrically connecting to the zeroth conductive layer 606. The interconnection structure 660 may include a top conductive layer 611 having a top exposed by the second dielectric layer 607.

The gate structure 602 may include a gate dielectric layer (not labeled), and a gate electrode layer (not labeled) formed on the gate dielectric layer. The gate dielectric layer may be made of silicon oxide or high-K gate dielectric material. The high-K gate dielectric material may include hafnium oxide, zirconium oxide, aluminum oxide, or hafnium silicon oxide, etc. The gate electrode layer may be made of one or more of Ti, Ta, Cu, Al, W, Ag, and Au. A working function layer may optionally and additionally be formed between the gate dielectric layer and the gate electrode layer.

The doping region 603 may be configured as a source region and/or a drain region of the transistor. When the transistor is a PMOS transistor, doping ions in the doping region 603 may be P-type ions, such as B, Ga, or In, etc. When the transistor is an NMOS transistor, the doping ions in the doping region 603 may be N-type ions, such as P, As, or Sb, etc.

Further, the top semiconductor structure may include a sidewall spacer 612 formed on the sidewall of the gate structure 602. In one embodiment, the sidewall spacer may be a single layer structure, and may be made of silicon nitride. In another embodiment, the sidewall spacer may also be made of silicon oxide, silicon carbide, silicon carbonitride, silicon oxycarbonitride, silicon oxynitride, boron nitride, or boron carbonitride, etc. In certain embodiments, the sidewall spacer may be a stacked structure. The sidewall spacer may be made of any two of silicon oxide, silicon carbide, silicon carbonitride, silicon oxycarbonitride, silicon oxynitride, boron nitride, or boron carbonitride, etc.

The first dielectric layer 604 may cover the top and sidewall of the gate structure 602. In one embodiment, the first dielectric layer 604 may be a single layer structure. The first dielectric layer 604 may be made of silicon oxide. In another embodiment, the first dielectric layer 604 may also be made of silicon nitride, or silicon oxynitride, etc. In certain embodiments, the first dielectric layer 604 may be a stacked structure. The first dielectric layer 604 may be made of any two of silicon oxide, silicon nitride, or silicon oxynitride, etc.

The zeroth conductive plug 605 may be configured to electrically connect the zeroth conductive layer 606 and the interconnection structure 660 formed inside the second dielectric layer 607. In one embodiment, the zeroth conductive plug 605 may be formed on the top surface of the gate structure 602, and may have a top coplanar with the top of the first dielectric layer 604. In certain embodiments, the zeroth conductive plug 605 may also be formed on the surface of the doping region. In one embodiment, the zeroth conductive plug 605 may be made of a conductive material, including one or more of copper, aluminum, tungsten, and titanium.

In one embodiment, the zeroth conductive layer 606 may be formed on the first dielectric layer 604 and above the zeroth conductive plug 605. On the basis of the internal circuit connection requirements of the semiconductor structure, a plurality of the discrete zeroth conductive layers 606 may be formed on the first dielectric layer 604. The zeroth conductive layer 606 may be made of a conductive material, including copper, or aluminum, etc. In one embodiment, the zeroth conductive layer 606 may be made of copper.

In one embodiment, the position of the zeroth conductive layer 606 may correspond to the position of the carrier top conductive layer 503. In other words, the projection of the zeroth conductive layer 606 on the carrier substrate 501 may be close to or have an overlap with the projection of the carrier top conductive layer 503 on the carrier substrate 501. Thus, the conductive plug 670 may be in contact with the zeroth conductive layer 606 and the carrier top conductive layer 503 at the same time.

In one embodiment, the interconnection structure 660 may include N (N≥2) conductive layers and an N-th conductive plug (not labeled) between the N−1-th conductive layer (not labeled) and the N-th conductive layer along a direction perpendicular to the top substrate 601 and towards the second dielectric layer 607 from the top substrate 601. The N-th conductive layer may be electrically connected to the N−1-th conductive layer through the N-th conductive plug. The N-th conductive layer may be the top conductive layer 611 having a top exposed by the second dielectric layer 607.

The second dielectric layer 607 may include at least one sub-dielectric layer. The second dielectric layer 607 may be formed by stacking at least one sub-dielectric layer. The sub-dielectric layer may be made of silicon oxide, silicon nitride, silicon oxynitride, silicon carbonitride, or silicon oxycarbonitride, etc. For example, the second dielectric layer 607 may be a single layer structure including one sub-dielectric layer. The second dielectric layer 607 may also be a stacked structure including two sub-dielectric layers, five sub-dielectric layers, seven sub-dielectric layers, or ten sub-dielectric layers, etc.

In one embodiment, the interconnection structure 660 including the discrete two conductive layers is described herein as an example. The interconnection structure 660 may include the discretely arranged first conductive layer 609 and second conductive layer 611 along the direction towards the second dielectric layer 607 from the top substrate 601. The interconnection structure 660 may also include a second conductive plug 610 formed between the first conductive layer 609 and the second conductive layer 611. The first conductive layer 609 may be electrically connected to the second conductive layer 611 through the second conductive plug 610. Further, the interconnection structure 660 may include a first conductive plug 608 formed between the first conductive layer 609 and the zeroth conductive layer 606. The zeroth conductive layer 606 may be electrically connected to the first conductive layer 609 through the first conductive plug 608. The second conductive layer 611 may be the top conductive layer 611. In certain embodiments, the interconnection structure 660 may include only one conductive layer. The interconnection structure may include the top conductive layer, and the first conductive plug electrically connecting the top conductive layer to the zeroth conductive layer.

In one embodiment, N can be any natural number equal to or greater than two. For example, the interconnection structure may include five conductive layers, seven conductive layers, or ten conductive layers, etc. According to the number of the conductive layers, the corresponding number of the conductive plugs can be determined.

In one embodiment, the carrier dielectric layer 510 may include a carrier first dielectric layer 505 formed on the carrier substrate 501, and a carrier second dielectric layer 502 covering the carrier first dielectric layer 505. The carrier second dielectric layer 502 may expose the top of the carrier top conductive layer 503. The carrier top conductive layer 503 may be made of a conductive material, including copper or aluminum, etc. In one embodiment, the carrier top conductive layer 503 may be made of aluminum. A detailed description of the carrier semiconductor structure 500 can be referred to the corresponding description of the top semiconductor structure 600, and is not repeated herein.

In one embodiment, the conductive plug 670 may include a first plug portion 671 penetrating through the top substrate 601 and the first dielectric layer 604, and a second plug portion 672 penetrating through the second dielectric layer 607. The size of the second plug portion 672 may be smaller than the size of the first plug portion 671 along a direction parallel to the top substrate 601. The sidewall of the second plug portion 672 facing toward the zeroth conductive layer 606 may be in contactwith the zeroth conductive layer 606. The sidewall of the second plug portion 672 facing away from the zeroth conductive layer 606 may be connected to the sidewall of the first plug portion 671.

To avoid adverse effects on the conductive performance of the conductive plug 670, a ratio of a top dimension 'D1' of the second plug portion 672 to a bottom dimension 'D2' of the first plug portion 671 cannot be too small. On the other hand, to reduce the fabrication difficulty of forming the second plug portion 672, the ratio of the top dimension 'D1' of the second plug portion 672 to the bottom dimension 'D2' of the first plug portion 671 cannot be too large. Therefore, in one embodiment, the ratio of the top dimension 'D1' of the second plug portion 672 to the bottom dimension 'D2' of the first plug portion 671 may be in a range of approximately ⅓-⅔.

The packaging structure may also include an adhesive layer 520 formed between the second dielectric layer 607 and the carrier second dielectric layer 502. The top semiconductor structure 600 may be bonded to the carrier semiconductor structure 500 through the adhesive layer 520. The adhesive layer 520 may improve the bonding strength. In one embodiment, the adhesive layer 520 may be made of silicon oxide. In another embodiment, the adhesive layer 520 may also be made of silicon nitride.

Moreover, the packaging structure may include an etch protection layer 640 formed between the first plug portion 671 of the conductive plug 670 and each of the top substrate 601 and the first dielectric layer 604. When forming the conductive plug 670, the etch protection layer 640 may be configured to protect the sidewall of the top substrate 601 from being damaged by the etching process of forming the conductive plug 670.

A thickness of the etch protection layer 640 cannot be too thick or too small. If the thickness of the etch protection layer 640 is too small, it may be easy to cause the etch protection layer 640 to be fully etched and consumed during the process of forming the conductive plug 670, thus the sidewall of the top substrate 601 cannot be effectively protected. On the other hand, if the thickness of the etch protection layer 640 is too large, it may be easy to cause the formation space of the conductive plug 670 to be too small, thus the formation quality of the conductive plug 670 can be affected. Therefore, in one embodiment, the thickness of the etch protection layer 640 may be in a range of approximately 100 Å-5000 Å.

In one embodiment, the etch protection layer 640 may be made of silicon oxide. In another embodiment, the etch protection layer 640 may be made of silicon nitride, or silicon oxynitride, etc.

Further, the packaging structure may include a passivation layer 680 formed on the surface of the conductive plug 670. The passivation layer 680 may be configured to protect the conductive plug 670 from being oxidized due to exposure to the when exposing outside. In one embodiment, the passivation layer 680 may be made of an insulating material, including silicon oxide, silicon nitride, silicon oxynitride, or resinous materials, etc.

Figure 3:
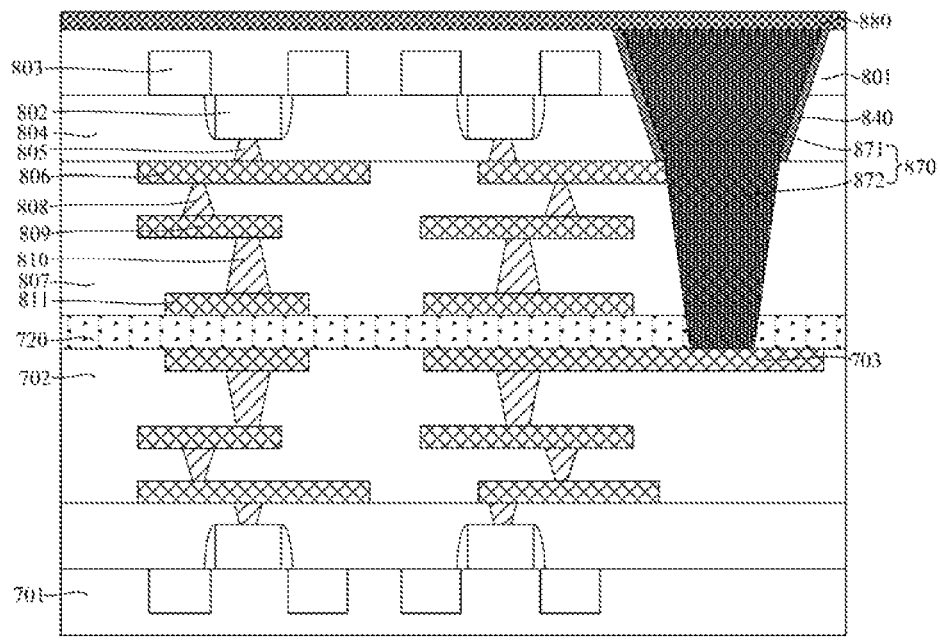
FIG. 3 illustrates another exemplary packaging structure consistent with various disclosed embodiments of the present disclosure.

FIG. 3 illustrates another packaging structure consistent with the disclosed embodiments. The difference between the structure in FIG. 3 and the structure in FIG. 2 may include the following. In FIG. 3, the zeroth conductive layer 806 may be made of aluminum. The conductive plug 870 may include a third plug portion 871 penetrating through the top substrate 801 and the first dielectric layer 804, and a fourth plug portion 872 penetrating through the second dielectric layer 807. A sidewall of the fourth plug portion 872 may be connected to a sidewall of the third plug portion 871; and another sidewall of the fourth plug portion 872 facing toward the zeroth conductive layer 806 may be in contact with the zeroth conductive layer 806. A detailed description of the packaging structure in FIG. 3 can be referred to the corresponding description of the packaging structure in FIG. 2, and is not repeated herein.

In the packaging structure consistent with the disclosed embodiments, electrical connection of the top semiconductor structure 600 to the carrier semiconductor structure 500 can be achieved through the conductive plug 670 (shown in FIG. 2) formed at one side of the zeroth conductive layer 606 (shown in FIG. 2). Compared to the existing process of respectively forming the two conductive plugs electrically connecting to the zeroth conductive layer and the carrier top conductive layer, and forming the connection conductive layer connecting to the conductive plugs, the packaging process in the present disclosure may be simpler, and the formed packaging structure may have a higher device integration degree.

Correspondingly, a packaging method is also provided. FIG. 15 illustrates an exemplary packaging process to form a packaging structure consistent with the disclosed embodiments; and FIGS. 4-14 illustrate packaging structures corresponding to certain stages of the exemplary packaging process.

Figure 4:
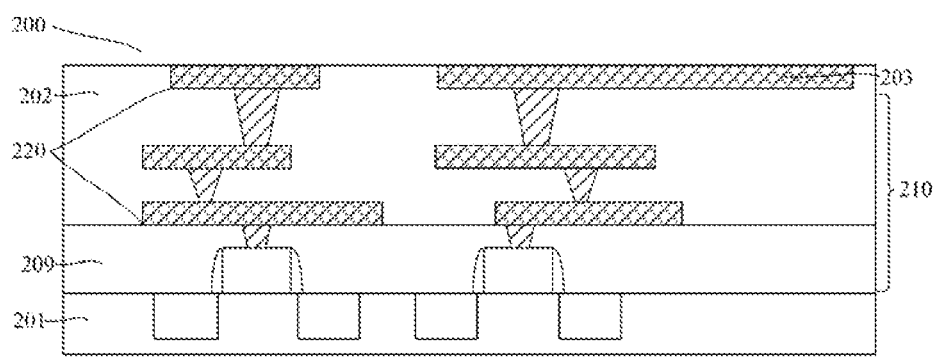
FIGS. 4-14 illustrate packaging structures corresponding to certain stages of an exemplary packaging process to form a packaging structure consistent with various disclosed embodiments of the present disclosure.

As shown in FIG. 15, at the beginning of the packaging process, a carrier semiconductor structure with certain structures may be provided (S101). FIG. 4 illustrates a corresponding semiconductor structure.

Referring to FIG. 4, a carrier semiconductor structure 200 may be provided. The carrier semiconductor structure 200 may include a carrier substrate 201, a carrier dielectric layer 210 formed on the carrier substrate 201, and a carrier interconnection structure 220 formed inside the carrier dielectric layer. The carrier interconnection structure 220 may include a carrier top conductive layer 203 having a top exposed by the carrier dielectric layer 210. The carrier top conductive layer 203 may be made of a conductive material, including copper, or aluminum, etc. In one embodiment, the carrier top conductive layer 203 may be made of aluminum.

In one embodiment, the carrier dielectric layer 210 may include a carrier first dielectric layer 209 formed on the carrier substrate 201, and a carrier second dielectric layer 202 covering the carrier first dielectric layer 209. The carrier second dielectric layer 202 may expose the top of the carrier top conductive layer 203. A detailed description of the carrier semiconductor structure 200 may be referred to the corresponding description of a subsequent top semiconductor structure, and is not repeated herein.

Figure 5:
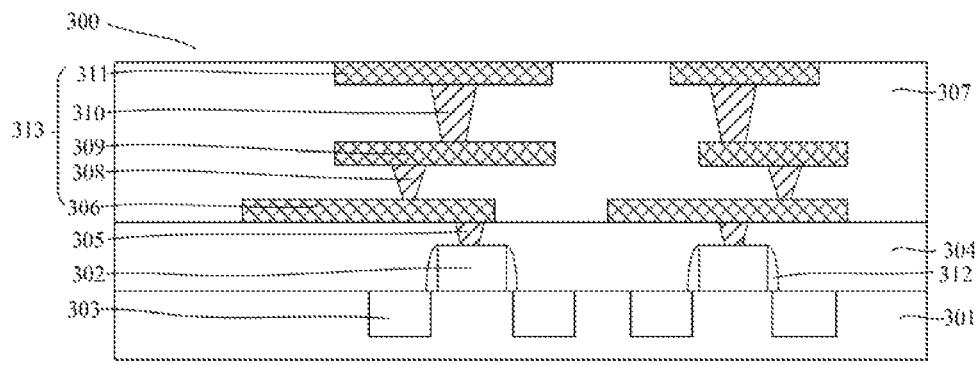

Returning to FIG. 15, after providing the carrier semiconductor structure, a top semiconductor structure with certain structures may be provided (S102). FIG. 5 illustrates a corresponding semiconductor structure.

Referring to FIG. 5, a top semiconductor structure 300 may be provided. The top semiconductor structure 300 may include a top substrate 301. The top substrate 301 may include a front face (not labeled) and a back face (not labeled) configured facing toward the front face. The top semiconductor structure may also include a first dielectric layer 304 formed on the front surface of the top substrate 301, a zeroth conductive layer 306 formed on the first dielectric layer 304, and a second dielectric layer 307 covering the first dielectric layer 304 and the zeroth conductive layer 306.

In one embodiment, the top substrate 301 may be made of silicon. In another embodiment, the top substrate 301 may be made of germanium, silicon germanium, silicon carbide, gallium arsenide, or indium gallium, etc. In certain embodiments, the top substrate 301 may be a semiconductor on insulator (SOI) substrate formed by a bottom semiconductor layer, an insulating material layer, and a top semiconductor layer. The bottom semiconductor layer may be made of silicon, germanium, silicon germanium, silicon carbide, gallium arsenide, or indium gallium, etc. The insulating material layer may be made of silicon oxide, silicon nitride, silicon oxynitride, silicon carbonitride, or silicon oxycarbonitride, etc. The top semiconductor layer may be made of silicon, germanium, silicon germanium, silicon carbide, gallium arsenide, or indium gallium, etc.

In one embodiment, the first dielectric layer 304 may be a single layer structure. The first dielectric layer 304 may be made of silicon oxide. In another embodiment, the first dielectric layer 304 may also be made of silicon nitride, or silicon oxynitride, etc. In certain embodiments, the first dielectric layer 304 may also be a stacked structure. The first dielectric layer 304 may be made of any two of silicon oxide, silicon nitride, and silicon oxynitride.

The zeroth conductive layer 306 may be made of a conductive material, including copper, or aluminum, etc. In one embodiment, the zeroth conductive layer 306 may be made of copper.

Moreover, in one embodiment, the top semiconductor structure 300 may include a gate structure 302 formed on the front surface of the top substrate 301, and a doping region 303 formed in the top substrate 301 at both sides of the gate structure 302. Correspondingly, the first dielectric layer 304 may cover the gate structure 302 and the doping region 303, and the top of the first dielectric layer 304 may be above the top of the gate structure 302.

The gate structure 302 may include a gate dielectric layer (not labeled), and a gate electrode layer (not labeled) formed on the gate dielectric layer. The gate dielectric layer may be made of silicon oxide, or high-K gate dielectric material. The high-K gate dielectric material may include hafnium oxide, zirconium oxide, aluminum oxide, or hafnium silicon oxide, etc. The gate electrode layer may be made of one or more of Ti. Ta, Cu, Al, W, Ag, and Au. A working function layer may be formed between the gate dielectric layer and the gate electrode layer.

The doping region 303 may be configured as a source region and/or a drain region of the transistor. When the formed transistor is a PMOS transistor, the doping ions in the doping region 303 may be P-type ions, such as B, Ga, or In, etc. When the formed transistor is an NMOS transistor, the doping ions in the doping region 303 may be N-type ions, such as P, As, or Sb, etc.

In addition, the top semiconductor structure 300 may include a sidewall spacer 312 formed on the sidewall of the gate structure 302. In one embodiment, the sidewall spacer 312 may be a single layer structure. The sidewall spacer 312 may be made of silicon nitride. In another embodiment, the sidewall spacer 312 may also be made of silicon oxide, silicon carbide, silicon carbonitride, silicon oxycarbonitride, silicon oxynitride, boron nitride, or boron carbonitride, etc. In certain embodiments, the sidewall spacer 312 may be a stacked structure. The sidewall spacer 312 may be made of any two of silicon oxide, silicon carbide, silicon carbonitride, silicon oxycarbonitride, silicon oxynitride, boron nitride, and boron carbonitride.

Further, the top semiconductor structure 300 may include a zeroth conductive plug 305 formed in the first dielectric layer 304 and above the gate structure 302, and directly contacting with the top of the gate structure 302; and an interconnection structure 313 formed in the second dielectric layer 307 and electrically connecting to the zeroth conductive layer 306. The interconnection structure 313 may include a top conductive layer 311 having a top exposed by the second dielectric layer 307.

In one embodiment, the zeroth conductive plug 305 may be connected to the zeroth conductive layer 306, and the zeroth conductive plug 305 may be electrically connected to the interconnection structure 313 in the second dielectric layer 307. The top of the zeroth conductive plug 305 may be coplanar with the top of the first dielectric layer 304.

In one embodiment, the zeroth conductive plug 305 may be formed on the top of the gate structure 302. In certain embodiments, the zeroth conductive plug 305 may also be formed on the doping region 303. In one embodiment, the zeroth conductive plug 305 may be made of a conductive material, including one or more of copper, aluminum, tungsten, and titanium.

In one embodiment, the zeroth conductive layer 306 may be formed on the first dielectric layer 304 and above the zeroth conductive plug 305. On the basis of the internal circuit connection requirements of the semiconductor structure, a plurality of the discrete zeroth conductive layers 306 may be formed on the first dielectric layer 304.

In one embodiment, along a direction perpendicular to the top substrate 301 and towards the second dielectric layer 307 from the top substrate 301, the interconnection structure 313 may include discrete N (N≥2) conductive layers, and an N-th conductive plug (not labeled) formed between the N−1-th conductive layer (not labeled) and the N-th conductive layer. The N−1-th conductive layer may be electrically connected to the N-th conductive layer through the N-th conductive plug. The N-th conductive layer may be the top conductive layer 311 having a top exposed by the second dielectric layer 307.

The second dielectric layer 307 may include at least one sub-dielectric layer. The second dielectric layer 307 may be formed by stacking at least one sub-dielectric layer. The sub-dielectric layer may be made of silicon oxide, silicon nitride, silicon oxynitride, silicon carbonitride, or silicon oxycarbonitride, etc. For example, the second dielectric layer 307 may be a single layer structure including one sub-dielectric layer. The second dielectric layer 307 may also be a stacked structure including two sub-dielectric layers, five sub-dielectric layers, seven sub-dielectric layers, or ten sub-dielectric layers, etc.

In one embodiment, the interconnection structure including the discrete two conductive layers is described herein as an example. Along the direction towards the second dielectric layer 307 from the top substrate 301, the interconnection structure 313 may include the discretely arranged first conductive layer 309 and second conductive layer 311, and a second conductive plug 310 formed between the first conductive layer 309 and the second conductive layer 311. The interconnection structure 313 may also include a first conductive plug 308 formed between the first conductive layer 309 and the zeroth conductive layer 306. The zeroth conductive layer 306 may be electrically connected to the first conductive layer 309 through the first conductive plug 308. The second conductive layer 311 may be the top conductive layer 311.

In certain embodiments, the interconnection structure 313 may only include one conductive layer. The interconnection structure 313 may include the top conductive layer and the first conductive plug electrically connecting the top conductive layer to the zero conductive layer.

In one embodiment, N may be any natural number larger than or equal to two. For example, the interconnection structure 313 may include five conductive layers, seven conductive layers, or ten conductive layers, etc. According to the number of the conductive layers, the corresponding number of the conductive plugs can be determined.

Figure 6:
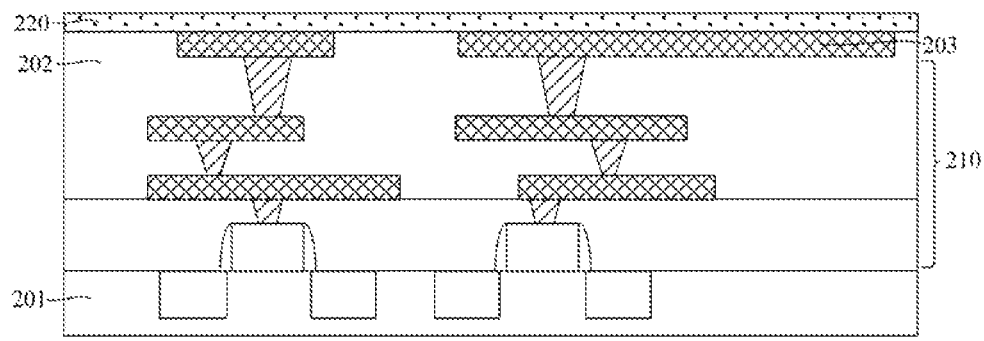

Returning to FIG. 15, after forming the carrier semiconductor structure, a second adhesive layer may be formed (S103). FIG. 6 illustrates a corresponding semiconductor structure.

Referring to FIG. 6, after forming the carrier semiconductor structure, a second adhesive layer 220 may be formed on the carrier dielectric layer 210. The second adhesive layer 220 may also cover the carrier top conductive layer 203.

For example, when forming the second adhesive layer 220 on the carrier dielectric layer 210, the second adhesive layer 220 may be formed on the carrier second dielectric layer 202. The bonding of the carrier semiconductor structure 200 to the top semiconductor structure 300 may be achieved through the second adhesive layer 220. The second adhesive layer 220 can enhance the bonding strength. In one embodiment, the second adhesive layer 220 may be made of silicon oxide. In another embodiment, the second adhesive layer 220 may be made of silicon nitride.

Figure 7:
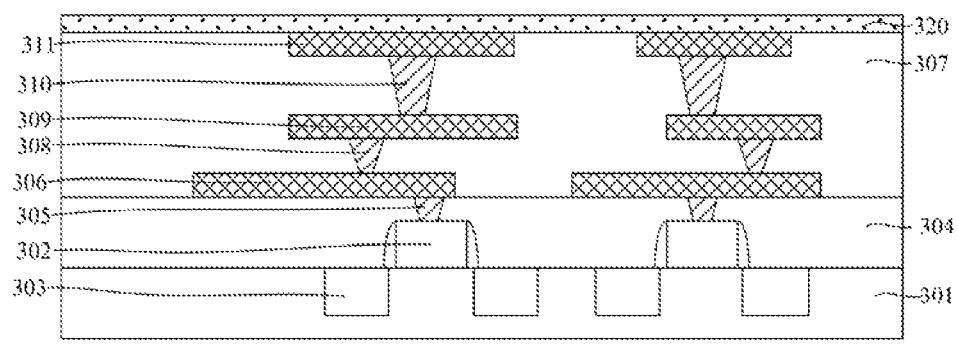

Returning to FIG. 15, after forming the top semiconductor structure, a first adhesive layer may be formed (S104). FIG. 7 illustrates a corresponding semiconductor structure.

Referring to FIG. 7, after forming the top semiconductor structure 300, a first adhesive layer 320 may be formed on the second dielectric layer 307. The first adhesive layer 320 may also cover the top conductive layer 311.

The bonding of the top semiconductor structure 300 to the carrier semiconductor structure 200 may be achieved through the first adhesive layer 320. The first adhesive layer 320 can enhance the bonding strength. In one embodiment, the first adhesive layer 320 may be made of silicon oxide. In another embodiment, the first adhesive layer 320 may be made of silicon nitride.

In one embodiment, the second adhesive layer 220 (shown in FIG. 6) may be first formed on the carrier dielectric layer 210 of the carrier semiconductor structure 200, and then the first adhesive layer 320 (shown in FIG. 7) may be formed on the second dielectric layer 307 of the top semiconductor structure 300. In another embodiment, the first adhesive layer may be first formed on the second dielectric layer 307 of the top semiconductor structure 300, and then the second adhesive layer may be formed on the carrier dielectric layer 210 of the carrier semiconductor structure 200.

Figure 8:
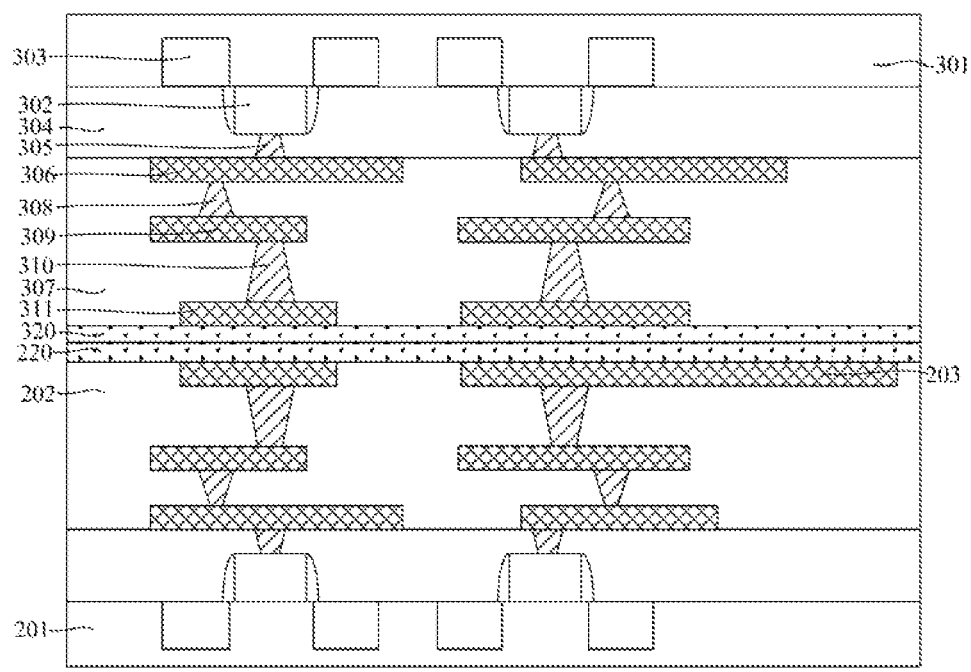

Returning to FIG. 15, after forming the first adhesive layer and the second adhesive layer, a bonding process may be performed (S105). FIG. 8 illustrates a corresponding semiconductor structure.

Referring to FIG. 8, the top semiconductor structure 300 may be inverted on the carrier semiconductor structure 200, and a bonding process may be performed on the top semiconductor structure 300 and the carrier semiconductor structure 200. The position of the zeroth conductive layer 306 may correspond to the position of the carrier top conductive layer 203.

For example, the projection of the zeroth conductive layer 306 on the carrier substrate 201 may be close to or have an overlap with the projection of the carrier top conductive layer 203 on the carrier substrate 201. Therefore, when subsequently forming the conductive plug, the conductive plug may be in contact with the zeroth conductive layer 306 and the carrier top conductive layer 203 at the same time.

The first adhesive layer 320 may be formed on the second dielectric layer 307, and the second adhesive layer 220 may be formed on the carrier second dielectric layer 202. Correspondingly, during the process of inverting the top semiconductor structure 300 on the carrier semiconductor structure 200, the first adhesive layer 320 may be in contact with the second adhesive layer 220 to achieve the bonding of the top semiconductor structure 300 to the carrier semiconductor structure 200.

In one embodiment, the bonding process may be a fusion bonding process. The top semiconductor structure 300 may be inverted on the carrier semiconductor structure 200, and the first adhesive layer 320 may be in contact with the second adhesive layer 220. The first adhesive layer 320 and the second adhesive layer 220 may be mutually diffused, and the fusion bonding may be achieved through the Si—O bond.

Returning to FIG. 15, after performing the bonding process, a conductive through hole may be formed (S106). FIGS. 9-12 illustrate corresponding semiconductor structures.

Referring to FIGS. 9-12, a conductive through hole 460 (shown in FIG. 12) may be formed at one side of the zeroth conductive layer 306 by sequentially etching the top substrate 301, the first dielectric layer 304 and the second dielectric layer 307 along a direction from the back surface to the front surface of the top substrate 301. The conductive through hole 460 may expose the zeroth conductive layer 306 and the carrier top conductive layer 203.

Figure 9:
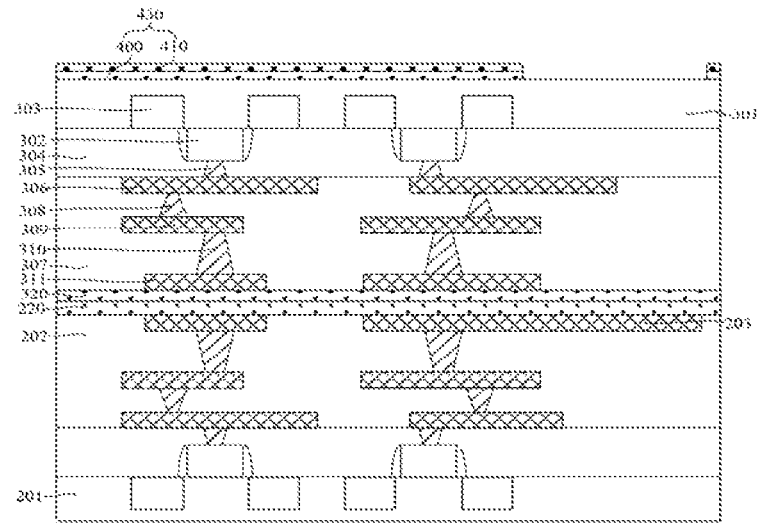

Referring to FIG. 9, before etching the top substrate 301, the first dielectric layer 304, and the second dielectric layer 307, a patterned hard mask layer 430 may be formed on the back surface of the top substrate 301. The patterned hard mask layer 430 may be configured as an etch mask of the etching process of subsequently forming the conductive through hole 460 (shown in FIG. 12). In addition, the patterned hard mask layer 430 may also protect the top substrate 301 from being damaged during the subsequent etching process.

In one embodiment, the hard mask layer 430 may be a stacked structure including a first hard mask layer 400 and a second hard mask layer 410 formed on the first hard mask layer 400. The first hard mask layer 400 may be made of hafnium oxide, and the second hard mask layer 420 may be made of one or more of silicon oxide, and silicon nitride.

The first hard mask layer 400 may be configured to protect the top substrate 301 from being damaged during the subsequent etching process, so as to further avoid a leakage current issue. The second hard mask layer 410 may protect the first hard mask layer 400, and be configured as an etch mask.

Figure 10:
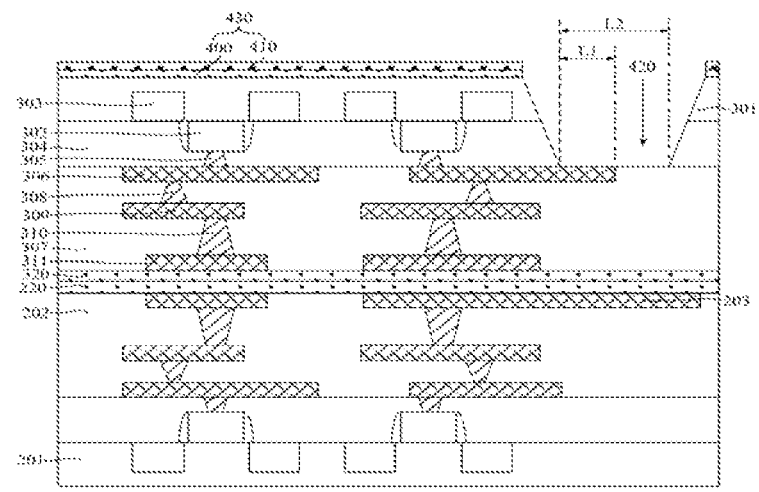

Referring to FIG. 10, a first trench 420 may be formed by sequentially etching the top substrate 301 and the first dielectric layer 304 along the direction from the back surface to the front surface of the top substrate 301. The first trench 420 may expose portions of the zeroth conductive layer 306 and portions of the second dielectric layer 307 contacting with the zeroth conductive layer 306. For example, the top substrate 301 and the first dielectric layer 304 may be etched by using the patterned hard mask layer 430 as an etch mask.

In one embodiment, the etching process of forming the first trench 420 may be a plasma dry etching process. For example, forming the first trench 420 may include: first performing a first etching process to etch the top substrate 301; then performing a second etching process to etch the first dielectric layer 304.

For example, the process of etching the top substrate 301 may include the following. The etching gas may be a mixed gas of $CF_4$, $CHF_3$, and $Cl_2$; and the diluent gas may be a mixed gas of Ar and He. The process of etching the first dielectric layer 304 may include the following. The etching gas may be $C_4F_8$, or $CF_4$, and $O_2$; and the diluent gas may be Ar.

To satisfy the process requirements of opening size and topography of the first trench 420, to expose portions of the second dielectric layer 307 contacting with the zeroth conductive layer 306, and to avoid damages on the zeroth conductive layer 306 caused by the etching process, parameters of the etching process may need to be controlled within a reasonable range.

In one embodiment, the process parameters of etching the top substrate 301 may include the following. The gas flow rate of the etching gas may be in a range of approximately 0 sccm-500 sccm; the gas flow rate of the diluent gas may be in a range of approximately 0 sccm-1000 sccm; the pressure may be in a range of approximately 0 Torr-1000 Torr; and the etching time may be in a range of approximately 0 seconds-500 seconds. The process parameters of etching the first dielectric layer 304 may include the following. The gas flow rate of the etching gas may be in a range of approximately 0 sccm-1000 sccm; the gas flow rate of the diluent gas may be in a range of approximately 0 sccm-5000 sccm; the pressure may be in a range of approximately 0 Torr-1000 Torr; and the etching time may be in a range of approximately 0 seconds-500 seconds.

In one embodiment, to ensure that a conductive plug subsequently formed in the first trench 420 is in contact with each of the zeroth conductive layer 306 and the carrier top conductive layer 203, and to improve the electrical contact effect, the first trench 420 may expose portions of the zeroth conductive layer 306 and portions of the second dielectric layer 307 contacting with the zeroth conductive layer 306.

A ratio of the size 'L1' of the zeroth conductive layer 306 exposed by the first trench 420 to the bottom size 'L2' of the first trench 420 cannot be too large or too small. If the ratio is too small, it may be easy to increase the fabrication difficulty of forming the first trench 420. If the ratio is too large, it may be easy to cause the size of a second trench subsequently formed by etching the second dielectric layer 307 along the first trench 420 to be too small, thus adversely affecting the formation quality of the conductive plug subsequently formed in the first trench 420 and the second trench. Therefore, in one embodiment, the ratio of the size 'L1' of the zeroth conductive layer 306 exposed by the first trench 420 to the bottom size 'L2' of the first trench 420 may be in a range of approximately ⅓-⅔. In another embodiment, the first trench may expose the sidewall of the zeroth conductive layer, and the bottom of the first trench may expose portions of the second dielectric layer contacting with the zeroth conductive layer.

Figure 11:
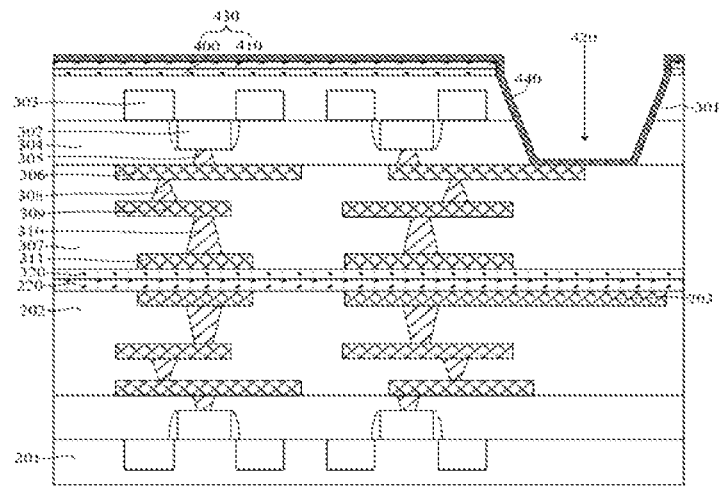

Referring to FIG. 11, an etch protection layer 440 may be formed on the sidewall of the first trench 420. The etch protection layer 440 may be configured to protect the sidewall of the top substrate 301 from being damaged during the subsequent etching process.

In one embodiment, the etch protection layer 440 may be made of silicon oxide. The process of forming the etch protection layer 440 may be a chemical vapor deposition process. In another embodiment, the etch protection layer 440 may be made of silicon nitride, or silicon oxynitride, etc.

During the process of forming the etch protection layer 440 on the sidewall of the first trench 420, the etch protection layer 440 may also cover the bottom of the first trench 420 and top of the hard mask layer 430.

A thickness of the etch protection layer 440 cannot be too thick or too thin. If the thickness of the etch protection layer 440 is too thin, it may be easy to cause the etch protection layer 440) to be completely etched and consumed during the subsequent etching process, thus the sidewall of the top substrate 301 cannot be effectively protected. If the thickness of the etch protection layer 440 is too thick, because the first trench 420 provides a spatial location for subsequently forming a conductive plug, it may be easy to cause the space of subsequently forming the conductive plug in the first trench 420 to be too small, thus impacting the formation quality of the conductive plug. Therefore, in one embodiment, the thickness of the etch protection layer 440 may be in a range of approximately 100 Å-5000 Å.

Figure 12:
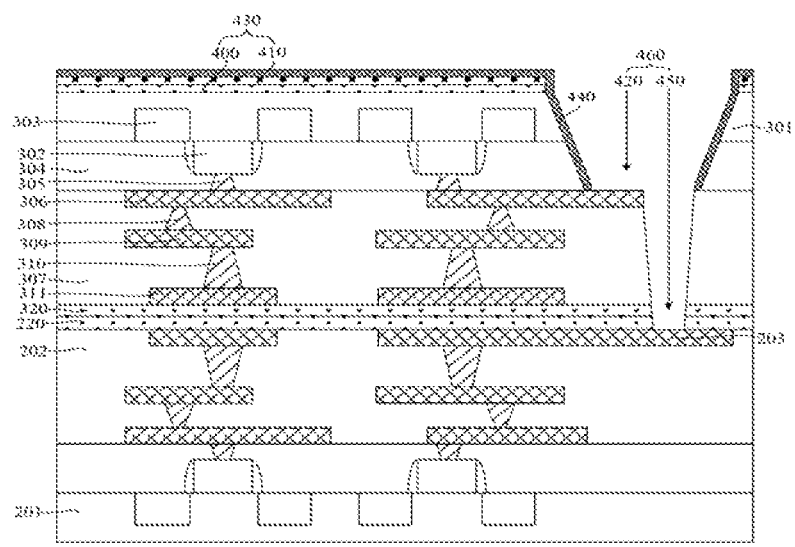

Referring to FIG. 12, a second trench 450 exposing the carrier top conductive layer 203 may be formed by etching the second dielectric layer 307 along the first trench 420. The second trench 450 and the first trench 420 may pass through each other to form the conductive through hole 460. For example, the second dielectric layer 307 may be etched by using the patterned hard mask layer 430 as an etching mask.

In one embodiment, the etch protection layer 440 may be formed on the bottom of the first trench 420. Correspondingly, the etch protection layer 440 may also be etched along the first trench 420 during the process of forming the conductive through hole 460. The first adhesive layer 320 and the second adhesive layer 220 may be formed between the second dielectric layer 307 and the carrier second dielectric layer 202. Correspondingly, the first adhesive layer 320 and the second adhesive layer 220 may also be etched during the process of forming the conductive through hole 460.

In one embodiment, the first dielectric layer 304 may be made of silicon oxide. The second dielectric layer 307 may be made of silicon oxide. The etch protection layer 440 may be made of silicon oxide. The first adhesive layer 320 and the second adhesive layer 220 may be made of silicon oxide. Therefore, the second trench 450 may be formed by using a same single etching process.

In one embodiment, the process of forming the second trench 450 may be a plasma dry etching process. The plasma dry etching process may include the following. The etching gas may be a mixed gas of $C_4F_8$, $CF_4$ and $O_2$, and the diluent gas may be Ar.

To satisfy the process requirements of the opening size and the topography of the second trench 450, to expose the carrier top conductive layer 203, and to avoid damages on the zeroth conductive layer 306 and the carrier top conductive layer 203 caused by the etching process, parameters of the etching process may need to be controlled within a reasonable range.

In one embodiment, the process parameters of etching the etch protection layer 440, the second dielectric layer 307, the first adhesive layer 320, and the second adhesive layer 220 may include the following. The gas flow rate of the etching gas may be in a range of approximately 0 sccm-1000 sccm; the gas flow rate of the diluent gas may be in a range of approximately 0 sccm-5000 sccm; the pressure may be in a range of approximately 0 Torr-1000 Torr; and the etching time may be in a range of approximately 0 seconds-500 seconds.

In one embodiment, the zeroth conductive layer 306 may be made of copper. The first trench 420 may expose portions of the zeroth conductive layer 306 and portions of the second dielectric layer 307 contacting with the zeroth conductive layer 306. Correspondingly, after forming the second trench 450, the first trench 420 may expose the top and side surfaces of the zeroth conductive layer 306.

In another embodiment, the zeroth conductive layer 306 may be made of aluminum. During the etching process of forming the second trench, the etching rate of the second dielectric layer may be similar to the etching rate of aluminum, thus the aluminum may be easily etched away. Correspondingly, forming the conductive through hole may include forming a third trench by sequentially etching the top substrate and the first dielectric layer along the direction from the back surface to the front surface of the top substrate. The third trench may expose the sidewall of the zeroth conductive layer, and the bottom of the third trench may expose portions of the second dielectric layer contacting with the zeroth conductive layer. Forming the conductive through hole may also include forming an etch protection layer on the sidewall of the third trench. Further, forming the conductive through hole may include forming a fourth trench exposing the carrier top conductive layer by etching the second dielectric layer along the third trench. The fourth trench and the third trench may pass through each other to form the conductive through hole.

Figure 13:
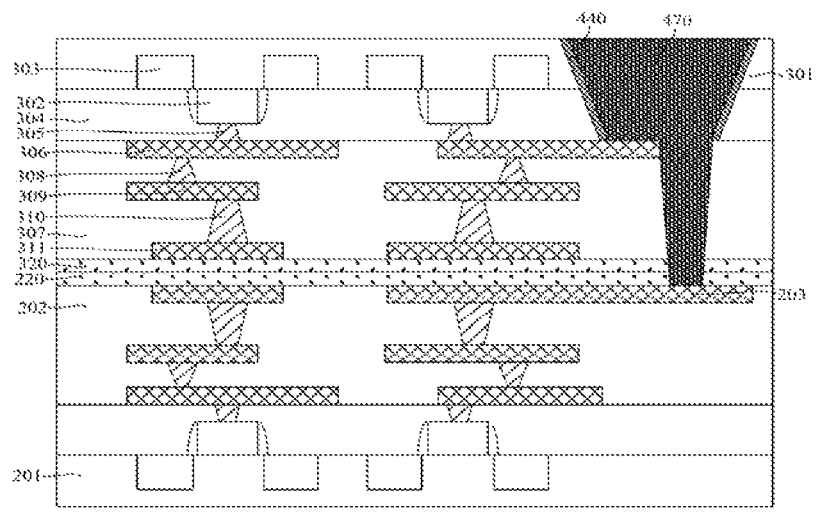

Returning to FIG. 15, after forming the conductive through hole, a conductive plug may be formed (S107). FIG. 13 illustrates a corresponding semiconductor structure.

Referring to FIG. 13, a conductive plug 470 may be formed to fill up the conductive through hole 460 (shown in FIG. 12). For example, forming the conductive plug 470 may include filling the conductive through hole 460 with a conductive material layer. The top of the conductive material layer may be above the top of the etch protection layer 440. Forming the conductive plug 470 may also include planarizing the conductive material layer to form the conductive plug 470 in the conductive through hole 460. Any one of the conductive plugs 470 may be isolated from each other along a direction parallel to the top substrate 301. In one embodiment, the conductive plug 470 may be made of a conductive material, including one or more of copper, aluminum, tungsten, and titanium.

In one embodiment, during the process of planarizing the conductive material layer, the etch protection layer 440 and the hard mask layer 430 (shown in FIG. 13) above the back surface of the top substrate 301 may also be removed. The top of the conductive plug 470 may be coplanar with the back surface of the top substrate 301. In certain embodiments, after forming the conductive plug, the etch protection layer 440 and the hard mask layer 430 formed on the back surface of the top substrate 301 may be retained.

In one embodiment, after forming the second trench 450 (shown in FIG. 12), the first trench 420 may expose the top and side surfaces of the zeroth conductive layer 306. Correspondingly, the conductive plug 470 may be in contact with the top and side surfaces of the zeroth conductive layer 306.

In another embodiment, after forming the second trench 450, the first trench 420 may only expose the sidewall of the zeroth conductive layer 306. Correspondingly, the conductive plug 470 may only be in contact with the sidewall of the zeroth conductive layer 306.

Figure 14:
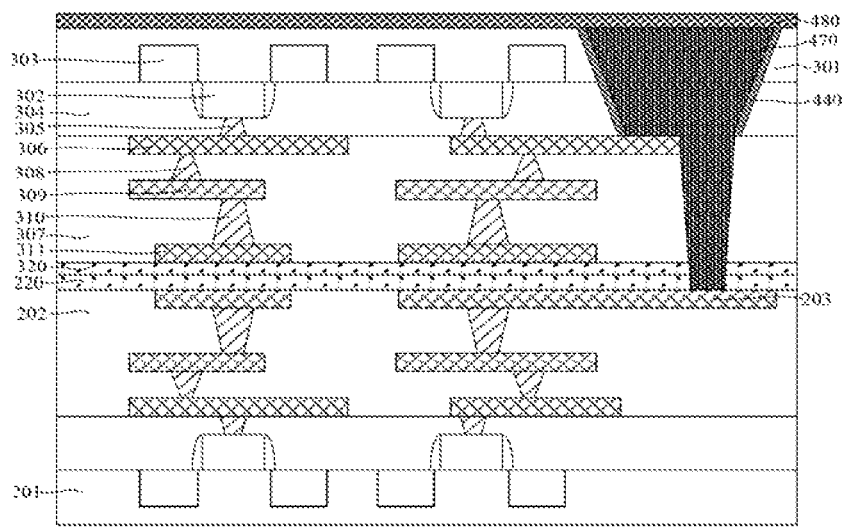

Returning to FIG. 15, after forming the conductive plug, a passivation layer may be formed (S108). FIG. 14 illustrates a corresponding semiconductor structure.

Referring to FIG. 14, after forming the conductive plug 470, a passivation layer 480 covering the conductive plug 470 may be formed. The passivation layer 480 may be formed to protect the conductive plug 470 from being oxidized due to exposure to the outside. In one embodiment, the passivation layer 480 may be an insulating material, including one or more of silicon oxide, silicon nitride, nitrogen oxide silicon, and resin material.

Accordingly, the conductive plug may be formed at one side of the zeroth conductive layer in the packaging structure consistent with the disclose embodiments, to achieve electrical connection of the zeroth conductive layer to the carrier top conductive layer. Compared to the existing process of respectively forming two conductive plugs electrically connecting to the zeroth conductive layer and the carrier top conductive layer and then forming the connection conductive layer connecting to the conductive plugs, the packaging process in the present disclosure is simpler and the packaging structure has a higher device integration degree.

After completing the bonding process of the top semiconductor structure and the carrier semiconductor structure, the conductive through hole (shown in FIG. 12) may be formed at one side of the zeroth conductive layer. The conductive through hole may expose the zeroth conductive layer and the carrier top conductive layer. The conductive plug (shown in FIG. 14) may be formed in the conductive through hole. The conductive plug may not only be in contact with the zeroth conductive layer, but also be in contact with the carrier top conductive layer. Therefore, it can be achieved that the zeroth conductive layer and the carrier top conductive layer are electrically connected through the same single conductive plug. Because the zeroth conductive layer is configured to achieve electrical connection with the top semiconductor structure, and the carrier top conductive layer is configured to achieve electrical connection with the carrier semiconductor structure, it can be further achieved that the encapsulated top semiconductor structure and carrier semiconductor structure are interconnected through the same single conductive plug.

Compared to the existing process of respectively forming two conductive plugs electrically connecting to the zeroth conductive layer and the carrier top conductive layer and then forming the connection conductive layer connecting to the two conductive plugs, the packaging process may be simplified in the present disclosure.

In addition, it can be achieved that the top semiconductor structure and the carrier semiconductor structure are interconnected through the same single conductive plug in the packaging structure in the present disclosure. Compared to the process of forming the two conductive plugs electrically connecting to each other and electrically connecting to the zeroth conductive layer and the carrier top conductive layer respectively, the device integration degree can be further improved in the packaging structure in the present disclosure.

Further, the conductive through hole (shown in FIG. 12) may be formed through a single photolithography process in the present disclosure. Compared to the process of forming conductive plugs electrically connecting to the zeroth conductive layer and the carrier top conductive layer and then forming the connection conductive layer connecting to the conductive plugs, the number of masks may be reduced in the present disclosure, thereby saving packaging cost.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A packaging structure, comprising:
   a carrier semiconductor structure including a carrier substrate, a carrier dielectric layer on the carrier substrate, and a carrier interconnection structure inside the carrier dielectric layer, wherein the carrier interconnection structure includes a carrier top conductive layer having a top surface exposed by the carrier dielectric layer, wherein the top surface of the carrier top conductive layer is coplanar with a top surface of the carrier dielectric layer;

a top semiconductor structure inversely bonded to the carrier semiconductor structure, and including a first dielectric layer on a top substrate, a zeroth conductive layer on the first dielectric layer, and a second dielectric layer covering the first dielectric layer and the zeroth conductive layer, wherein a position of the zeroth conductive layer corresponds to a position of the carrier top conductive layer; and a conductive plug formed on one side of the zeroth conductive layer, and penetrating through the top substrate, the first dielectric layer, and the second dielectric layer, wherein the conductive plug is electrically connected to each of the zeroth conductive layer and the carrier top conductive layer.

2. The packaging structure according to claim 1, wherein: the zeroth conductive layer is made of a material including one or more of copper and aluminum.

3. The packaging structure according to claim 1, wherein: the conductive plug includes a first plug portion penetrating through the top substrate and the first dielectric layer, and a second plug portion penetrating through the second dielectric layer;
a size of the second plug portion is smaller than a size of the first plug portion along a direction parallel to the top substrate;
a sidewall of the second plug portion facing toward the zeroth conductive layer is in contact with the zeroth conductive layer; and
the sidewall of the second plug portion facing away from the zeroth conductive layer is connected to a sidewall of the first plug portion.

4. The packaging structure according to claim 3, wherein: a ratio of a top dimension of the second plug portion to a bottom dimension of the first plug portion is in a range of approximately ⅓-⅔.

5. The packaging structure according to claim 1, wherein: the conductive plug includes a third plug portion penetrating through the top substrate and the first dielectric layer, and a fourth plug portion penetrating through the second dielectric layer;
a sidewall of the fourth plug portion is connected to a sidewall of the third plug portion; and
the sidewall of the fourth plug portion facing toward the zeroth conductive layer is in contact with the zeroth conductive layer.

6. A packaging structure, comprising:
a carrier semiconductor structure including a carrier substrate, a carrier dielectric layer on the carrier substrate, and a carrier interconnection structure inside the carrier dielectric layer, wherein the carrier interconnection structure includes a carrier top conductive layer having a top exposed by the carrier dielectric layer;
a top semiconductor structure inversely bonded to the carrier semiconductor structure, and including a first dielectric layer on a top substrate, a zeroth conductive layer on the first dielectric layer, and a second dielectric layer covering the first dielectric layer and the zeroth conductive layer, wherein a position of the zeroth conductive layer corresponds to a position of the carrier top conductive layer;
an adhesive layer formed between the second dielectric layer and the carrier dielectric layer; and
a conductive plug formed on one side of the zeroth conductive layer, and penetrating through the top substrate, the first dielectric layer, the adhesive layer, and the second dielectric layer, wherein the conductive plug is electrically connected to each of the zeroth conductive layer and the carrier top conductive layer.

7. The packaging structure according to claim 1, further including:
an etch protection layer formed between the conductive plug, and each of the top substrate and the first dielectric layer.

8. The packaging structure according to claim 7, wherein: the etch protection layer is made of a material including one or more of silicon oxide, silicon nitride, and silicon oxynitride.

9. The packaging structure according to claim 7, wherein: a thickness of the etch protection layer is in a range of approximately 100 Å-5000 Å.

10. A packaging method, comprising:
providing a carrier semiconductor structure including a carrier substrate, a carrier dielectric layer on the carrier substrate, and a carrier interconnection structure inside the carrier dielectric layer, wherein the carrier interconnection structure includes a carrier top conductive layer having a top surface exposed by the carrier dielectric layer, wherein the top surface of the carrier top conductive layer is coplanar with a top surface of the carrier dielectric layer;
providing a top semiconductor structure including a first dielectric layer on a top substrate, a zeroth conductive layer on the first dielectric layer, and a second dielectric layer covering the first dielectric layer and the zeroth conductive layer;
flipping the top semiconductor structure on the carrier semiconductor structure;
performing a bonding process on the top semiconductor structure and the carrier semiconductor structure, wherein a position of the zeroth conductive layer corresponds to a position of the carrier top conductive layer;
forming a conductive through hole on one side of the zeroth conductive layer by sequentially etching the top substrate, the first dielectric layer and the second dielectric layer along a direction from a back surface to a front surface of the top substrate, wherein the conductive through hole exposes the zeroth conductive layer and the carrier top conductive layer; and
forming a conductive plug to fill up the conductive through hole.

11. The method according to claim 10, wherein: the zeroth conductive layer is made of a material including one or more of copper and aluminum.

12. The method according to claim 10, wherein forming the conductive through hole includes:
forming a first trench by sequentially etching the top substrate and the first dielectric layer along the direction from the back surface to the front surface of the top substrate, wherein the first trench exposes portions of the zeroth conductive layer and portions of the second dielectric layer contacting with the zeroth conductive layer;
forming an etch protection layer on a sidewall of the first trench; and
forming a second trench exposing the carrier top conductive layer by etching the second dielectric layer along the first trench, wherein the second trench and the first trench pass through each other to form the conductive through hole.

13. The method according to claim 12, wherein:
a ratio of a size of the zeroth conductive layer exposed by the first trench to a bottom size of the first trench is in a range of approximately 1/3-2/3.

14. The method according to claim 12, wherein:
the etch protection layer is made of a material including one or more of silicon oxide, silicon nitride, and silicon oxynitride.

15. The method according to claim 12, wherein:
a thickness of the etch protection layer is in a range of approximately 100 Å-5000 Å.

16. The method according to claim 10, wherein forming the conductive through hole includes:
forming a third trench by sequentially etching the top substrate and the first dielectric layer along the direction from the back surface to the front surface of the top substrate, wherein the third trench exposes a sidewall of the zeroth conductive layer, and bottom of the third trench exposes portions of the second dielectric layer contacting with the zeroth conductive layer;
forming an etch protection layer on a sidewall of the third trench; and
forming a fourth trench exposing the carrier top conductive layer by etching the second dielectric layer along the third trench, wherein the fourth trench and the third trench pass through each other to form the conductive through hole.

17. The method according to claim 10, wherein:
an etching process of forming the conductive through hole includes a plasma dry etching process.

18. The method according to claim 17, wherein the etching process includes:
an etching gas including a mixed gas of $CF_4$, $CHF_3$, and $Cl_2$;
a diluent gas including a mixed gas of Ar and He;
a gas flow rate of the etching gas in a range of approximately 0 sccm-500 sccm;
a gas flow rate of the diluent gas in a range of approximately 0 sccm-1000 sccm;
a pressure in a range of approximately 0 Torr-1000 Torr; and
an etching time in a range of approximately 0 seconds-500 seconds.

19. The method according to claim 17, wherein:
an etching gas including a mixed gas of $C_4F_8$, or $CF_4$, and $O_2$;
a diluent gas including Ar;
a gas flow rate of the etching gas in a range of approximately 0 sccm-1000 sccm;
a gas flow rate of the diluent gas in a range of approximately 0 sccm-5000 sccm;
a pressure in a range of approximately 0 Torr-1000 Torr; and
an etching time in a range of approximately 0 seconds-500 seconds.

20. The method according to claim 10, before flipping the top semiconductor substrate on the carrier semiconductor substrate, further including:
forming a first adhesive layer on the second dielectric layer;
forming a second adhesive layer on the carrier dielectric layer, wherein the second adhesive layer covers the carrier top conductive layer;
contacting the first adhesive layer to the second adhesive layer when flipping the top semiconductor substrate on the carrier semiconductor substrate; and
etching the first adhesive layer and the second adhesive layer when forming the conductive through hole.

* * * * *